United States Patent [19]

Elkind et al.

[11] Patent Number: 5,157,000
[45] Date of Patent: Oct. 20, 1992

[54] METHOD FOR DRY ETCHING OPENINGS IN INTEGRATED CIRCUIT LAYERS

[75] Inventors: Jerome L. Elkind, Dallas; Patricia B. Smith, Grapevine; Larry D. Hutchins; Joseph D. Luttmer, both of Richardson; Rudy L. York, Plano; Julie S. England, Dallas, all of Tex.

[73] Assignee: Texas Instruments Incorporated, Dallas, Tex.

[21] Appl. No.: 652,506

[22] Filed: Feb. 8, 1991

Related U.S. Application Data

[63] Continuation of Ser. No. 377,514, Jul. 10, 1989.

[51] Int. Cl.$^5$ .................... H01L 21/00; H01L 21/02; H01L 21/30; B44C 1/22
[52] U.S. Cl. .................... 437/225; 437/228; 437/233; 437/234; 148/DIG. 51; 427/576; 156/643; 156/646
[58] Field of Search .................... 437/225, 228, 229; 148/DIG. 51, DIG. 75; 156/643, 646, 653, 657, 659.1; 204/192.32, 192.36; 427/38, 39

[56] References Cited

U.S. PATENT DOCUMENTS

| 4,436,761 | 3/1984 | Hayashi et al. | 427/29 |
| 4,447,291 | 5/1984 | Schulte | 156/643 |
| 4,579,609 | 4/1986 | Reif et al. | 437/171 |
| 4,684,812 | 8/1987 | Tew et al. | 250/578 |
| 4,686,373 | 8/1987 | Tew et al. | 250/578 |
| 4,698,128 | 10/1987 | Berglund et al. | 204/192.32 |
| 4,779,004 | 10/1988 | Tew et al. | 250/578 |
| 4,818,326 | 4/1989 | Liu et al. | 156/643 |
| 5,017,511 | 5/1991 | Elkind et al. | 437/225 |

FOREIGN PATENT DOCUMENTS 1184830 7/1989 Japan .

OTHER PUBLICATIONS

Ghandhi, S., VLSI Fabrication Principles, Wiley & Sons, Chap. 9, p. 523, 1983.
Spencer, J., Stoichiometric Dry Etching of Mercury Cadmium-Telluride Using a Secondary Afterglow Reactor, J. Vac. Sci. Technol. A, Vac. Surf. Films (USA), vol. 7, No. 3, pt. 1, pp. 676-681, Jun. 1989.
Chevallir & Mircea, "Hydrogen Plasma Etching of CdTe", Journal of Material Science Letters 5 (1986) 1319-1320.
"Microwave Plasma Processing The Power and the Potential" PlasmaQuest, vol. 1, No. 1 (Jun. 1988).
Haag & Suhr, "Etching of Materials by Means of Organic Radicals", Plasma Chemistry and Plasma Processing, vol. 6, No. 3 (1986).
Ing & Chiang, "Hydrogen Plasma Transport of Se, As and Te", Journal of the Electrochemical Society, pp. 192-193 (Feb. 1966).
Paneth, "The Use of Free Methyl and Ethyl in Chemical Synthesis" (Aug. 1933).
Spencer et al., "Stoichiometric Dry Etching of Mercury Cadmium Telluride Using a Secondary Aftergrow Reactor", American Vacuum Society, TX Chapter, p. 20 (1988).
Mitura et al., "Etching and Deposition Phenomena in an r.f. CH4 Plasma", Thin Solid Films, 147, pp. 83-92 (1987).

Primary Examiner—Brian E. Hearn
Assistant Examiner—B. Everhart
Attorney, Agent, or Firm—René E. Grossman; Richard L. Donaldson

[57] ABSTRACT

A process is disclosed through which vias (50) can be formed by the reaction of an etchant species (52) with a mercury cadmium telluride (HgCdTe) or zinc sulfide (ZnS) layer (42). The activating gases (20) are preferably a hydrogen gas or a methane gas which is excited in a diode plasma reactor (100) which has an RF power source (13) applied to one of two parallel electrodes. The etching occurs in selected areas in a photoresist pattern (44) residing over the ZnS or HgCdTe layer (42). Wet etching the layer (42) with a wet etchant (54) following the dry etching, improves the via (50) by making the walls (48) smoother, and allowing for expansion of the vias (50) to a dimension necessary for proper operation of a HgCdTe-based infrared detector.

20 Claims, 1 Drawing Sheet

METHOD FOR DRY ETCHING OPENINGS IN INTEGRATED CIRCUIT LAYERS

RELATED APPLICATIONS

This application is a continuation of copending U.S. application Ser. No. 07/377,514, filed Jul. 10, 1989.

TECHNICAL FIELD OF THE INVENTION

This invention relates in general to dry etching of integrated circuits, and more particularly to a process and apparatus for dry etching openings used in infrared detectors.

BACKGROUND OF THE INVENTION

An advanced method for detecting infrared light has recently been developed which utilizes mercury cadmium telluride (HgCdTe). A zinc sulfide (ZnS) layer is generally deposited onto the HgCdTe layer to act as an insulator for the detector. Dry etching techniques for etching through the HgCdTe and ZnS layers have used energy from a remote microwave plasma discharge for activating an etchant to reactively remove selected portions of the HgCdTe and ZnS layers of a wafer.

Despite advancements in this dry etching technique, special arrangements must be taken to excite a fluorine-containing gas in a microwave discharge remote from the reaction zone of the wafer. Additionally, precautions must be taken in handling the fluorine gas because of its corrosive nature. Other problems have resulted from using a hydrocarbon gas as the etchant, as under some conditions of flow rates and pressures the hydrocarbon gas will polymerize to form undesirable films on the surfaces of the wafer.

When forming vias in the wafer, prior dry etchants tend to damage other areas which are not intended to be contacted. This type of unintentional damage can result in electrical short circuiting of the integrated circuit. Additionally, dry etching techniques tend to leave rough surfaces when forming vias in a wafer due to non-uniform etching of the separate components in a multi-component system, such as HgCdTe. Such roughness can cause operational problems related to the damage produced in the material.

Therefore, a need has arisen for a process for dry etching infrared detector layers which does not require a remote microwave plasma source for exciting a fluorine gas. It would also be desirable to have a dry etching process available which can eliminate the polymerization of films on the surface of the wafer. Additionally, a need has arisen for a method of forming a via which does not damage the wafer surface by inadvertent etching in protected (resist-pattern-defined) areas and which forms smooth via walls.

SUMMARY OF THE INVENTION

The present invention provides an etchant for etching mercury cadmium telluride (HgCdTe) and zinc sulfide (ZnS) layers used in an infrared detector. One aspect of the present invention is a method for dry etching a wafer made of a Group II-element and a Group VI-element such as HgCdTe and ZnS. The wafer is initially introduced into a reaction vessel. The wafer has a photoresist pattern formed on its surface which will permit via formation in specific areas of the wafer. Once the vessel has been evacuated, in situ plasma is generated in the gap between two parallel plates. By applying an electric field across these plates, electrons traverse the gap. The continuous activity of the electrons with methane gas held at a constant pressure within the reactor causes activation of the methane to species (dissociated and ionized) which then etch the via structures. After the openings have been formed, and the wafer has been removed from the dry etching apparatus, a wet chemical etchant, such as a solution of bromine and methanol, is exposed to the dry etched portions of the wafer to smooth and expand the openings to the desired dimension. After the openings have been formed, the photoresist pattern is removed from the surface of the wafer.

As part of the invention, the generated in situ plasma is capable of dry etching compounds composed of Group II and Group VI elements, such as mercury, cadmium, tellurium, zinc, sulfur, selenium, and combinations thereof. In an alternative embodiment, the free—radical-containing activation gas may comprise hydrogen, ethane, propane, and any other methyl-containing hydrocarbons or a combination thereof.

In the preferred embodiment, the temperature of the wafer is controlled between approximately 15 and approximately 130 degrees centigrade to ensure that the layers are not damaged by excessive heat. Additionally, the hydrocarbon gas or the hydrogen gas used as the etchant gas may be mixed with an inert gas within the chamber. The inert gas may be argon, helium, neon, or a combination thereof.

The present invention presents technical advantages over prior dry etching techniques which use a remote microwave system for exciting a fluorine gas to activate the reactive gases to free-radicals or ionized species used for etching, because of the present technique's capacity for increased throughput, process simplifications and the ability to operate without corrosive fluorine gas. Additionally, the present invention presents technical advantages because of its highly anisotropic etch-profile capability, its ability to reduce the extent of hydrocarbon-based polymerization on the wafer surface, and the reduction in physical damage to the wafer which results in smoother sidewall feature surfaces.

BRIEF DESCRIPTION OF THE DRAWINGS

Other aspects of the invention and their advantages may be appreciated with reference to the following detailed description taken in conjunction with the appended drawings in which.

DETAILED DESCRIPTION OF THE INVENTION

Figure 1:
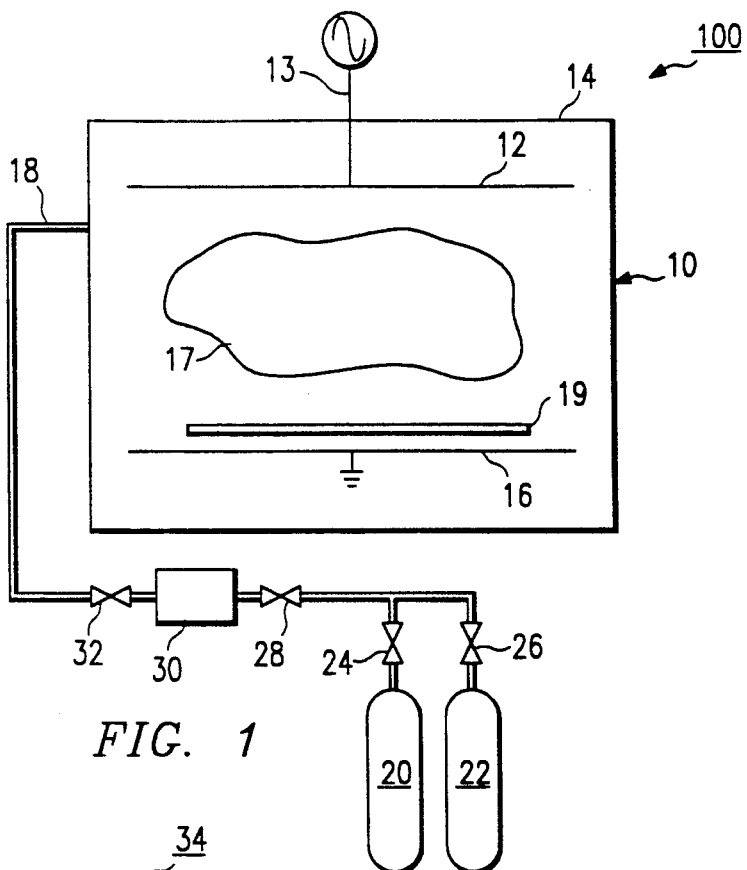
FIG. 1 is a schematic diagram of an etching apparatus according to the invention.

Referring to FIG. 1, a schematic representation of an etching apparatus according to the present invention is shown and is generally designated 100. Apparatus 100 is more commonly known as a diode plasma reactor. A reactor chamber or vessel for use with the present invention is preferably capable of maintaining an internal pressure between approximately 0.01 to 10 torr and an internal wafer temperature of between approximately 15 degrees to 130 degrees centigrade. An RF powered electrode 12 is connected to an RF power source 13, which can, for example, generate 150 watts at 13.56 megahertz. Vessel 10 further includes a ground or substrate electrode 16. For the etching step of the invention, the distance between the electrode 12 and the electrode 16 should be maintained in a range of approximately 2 to 6 inches, and is preferably approximately 4 inches. A plasma 17 is formed between electrodes 12 and 16 and is in contact with wafer 19 on which material such as a CdTe layer, HgCdTe layer or a ZnS layer has been deposited. Subsequent disclosure will discern the distinctions between operating parameters when using the HgCdTe layer versus the ZnS layer formed on wafer.

An inlet 18 to vessel 14 introduces the gas etchant into chamber 10. In the preferred embodiment, the gas etchant comprises hydrogen or a hydrocarbon, preferably methane or ethane. This etchant originates from the active-gas source 20. Additionally, an inert gas source 22 can be mixed with the re-active gas source 20 in accordance with the present invention. Inert gas 22 can comprise helium, argon, neon, or a combination thereof. Valves 24, 26, and 28 are operated to control the relative flows of the gases from sources 20 and 22.

Active gas source 20 is initially brought through valves 24 and 28 into a mixing chamber 30. A separate amount of inert gas 22 is released through valve 26 into the mixing chamber 30. As mixed, the gas etchant species proceeds through a valve 32 to chamber 14, where the gas is activated through excitation by radio frequency (RF) energy from source 13 to produce the plasma 17.

In accordance with the present invention, wafer 19 comprises a material from the II and VI elemental groups of the periodic table. More specifically, examples of Group II and Group VI compounds are mercury telluride, cadmium telluride, mercury cadmium telluride, zinc selenide, cadmium sulfide and zinc sulfide. Active gas source 20 may comprise a plurality of different materials. For example, active source 20 may comprise hydrogen, methane, ethane, propane, other hydrocarbons and a combination thereof.

In the present invention, it is important to maintain the substrate wafer 19 temperature at a relatively constant and low temperature. More specifically, it is preferable to control the temperature of the wafer 19 in the chamber 10 between approximately 15 degrees centigrade and approximately 130 centigrade to ensure that HgCdTe or CdTe layers are not damaged during processing. Cadmium telluride etching exhibits a temperature dependence and the etching rate is a function of the CdTe temperature. See L. Svob, et al., *Hydrogen Plasma Etching of CdTe*, Journal of Materials Science Letters 5 (1986) 1319–1320.

One advantage of the present invention is that the processing steps are reduced. The present etching process requires only an in situ RF plasma generation, whereas prior etching processes often required a remote microwave plasma generation for excitation of the active gas source 20. In accordance with the present invention, the in situ RF plasma source 13 is utilized to generate activated methyl or hydride etching species. These etchants have successfully been used to dry etch the II/VI compounds such as ZnS and HgCdTe or CdTe.

According to the present invention, four processes will be disclosed with specificity. Two processes are disclosed for etching ZnS layers and two processes are disclosed for the etching of HgCdTe layers. These four processes are conceptually similar to one another, since the chemistries of both Group II and Group VI elements are similar. For example, mercury, cadmium, tellurium, zinc, and sulfur all exist as stable dimethyl species as liquids or gases. These species can be $Hg(CH_3)_2$, $Cd(CH_3)_2$, $Te(CH_3)_2$, $Zn(CH_3)_2$, and $S(CH_3)_2$ which all exist with relatively low boiling points. Additionally, the dimethyl compounds are not the only alkylated Group II and Group VI species which exist. A number of diethyl and dipropyl species could be produced in accordance with the present invention as volatile, stable compounds of elements from Group II and Group VI upon activation of the corresponding hydrocarbon gas as the etchant.

One of the advantages of the present invention is that the etchant source is not limited to methane; ethane and propane and many other hydrocarbons can be activated for use as the etchant gas. It is preferable, however, to use methane gas because the dimethyl compounds are more volatile than the larger hydrocarbon compounds, and greater volatility is a desirable feature of an etching reaction. Additionally, if larger hydrocarbon gases are used as the etchant species, the hydrocarbon gases may be more likely to polymerize, leading to contamination of the wafer and reactor surfaces.

It has been found that neither methane nor any other hydrocarbon will react with the ZnS or HgCdTe at room temperature. The present invention uses in situ RF plasma excitation to produce reactants with sufficient energy for reaction with II–VI compounds to occur. As is well known in the art, it is necessary for the active gas originating from source 20 to possess sufficient energy in order for the etchant to react with the HgCdTe or the ZnS layers. Prior to the present invention, these reactions could not be induced without the use of a remote microwave plasma generated alone or in combination with in situ RF generated plasma.

In order to etch wafer 19, volatile species must form from the reaction of the gas source 20 with components of the wafer 19 The present invention shows a method for exposing the surface of wafer 19 to a plasma environment in order to permit an etching reaction to occur on wafer 19.

The activation of methane by an RF plasma can be illustrated by:

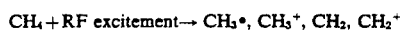

In the diode plasma reactor 100, methane gas source 20 may, upon excitation from an RF source, contain any one of several species of gas. These species include charged ions and uncharged neutral atoms. In accordance with the present invention, any of these activated species may be responsible for the chemical reaction between the activated source gas and the II–VI compounds which produce the volatile alkylated metallic species necessary for etching through the II–VI layers. Accordingly, hydrocarbon plasmas can be generated which chemically react with Group II and Group VI elemental components on a wafer 19 surface, thereby etching that surface, within a diode plasma reactor.

In the operation of the diode plasma reactor 100 disclosed above, two plates 12 and 16 of the reactor 100 are parallel and are separated by approximately 4 inches. When the RF power source 13 is applied to plate 12, electrons are forced to flow from one plate to the other. To enhance the flow of electrons, the pressure within the vessel can be reduced to less than 500 mtorr. As the electrons traverse the gap between the plates, the electrons accelerate. During the acceleration, collisions of the electrons occur with the methane or any other suitable gas used by the present invention. The collisions cause the dissociation and ionization necessary for activating the etchant. Accordingly, this process of activation by dissociation and ionization of the species produces an etchant which is capable of reactive removal of the wafer surface when the wafer is present on one of the metal plates 12 or 16.

In an alternative embodiment, gas source 20 may comprise hydrogen. Hydrogen plasma has been successfully used for etching Group II and Group VI-containing compounds.

As disclosed earlier, inert gas 22 can be used to enhance the etching of the HgCdTe and ZnS layers. Specifically, when methane or hydrogen are used as the active chemical etchant, argon can be used as a carrier or buffer gas. The actual gas mixture can vary from 0% to approximately 99% argon. The desired etching rate for the process is dependent upon the percentage of inert gas source 22. For example, at low RF power the higher inert gas source 22 concentration, the lower the etching rate. Typically, approximately 60% argon is used with the hydrogen gas and approximately 85% argon is used with the methane gas in the preferred process.

Argon is used as the inert buffer gas in the preferred embodiment. The function of the argon gas has not been entirely determined. For example, argon ions are present in the plasma as a result of electron impact on the argon atoms. The argon ions may in turn ionize and dissociate the hydrogen and methane. This secondary ionization could provide some of the activation necessary for etching in the process.

It has been observed that the use of hydrogen gas as the etchant can provide a very straight walled and anisotropic etch profile which has little or no undercut. This etching profile is a desirable feature when etching to form vias in wafers. In accordance with the present invention, an example of a hydrogen etchant can be illustrated.

EXAMPLE I

An RF plasma etch was performed in the laboratory for etching a HgCdTe layer. During processing, 1150 standard cubic centimeters per minute (sccm) of 100% hydrogen was introduced into the chamber and the pressure of the chamber was held at 0.4 torr. Once the gas was admitted to the chamber, an RF power source 13 of approximately 140 watts was applied to the electrode 12 and the electrode 12 was cooled with 14 degrees centigrade water. This experiment resulted in an etching rate of approximately 1.2 microns of HgCdTe per minute. It was observed that the magnitude of RF power was one of the more important parameters of the process. The magnitude of the RF power was found to be directly proportional to the smoothness of the walls, the straightness of the walls and the etch rate of the HgCdTe wafer. In its operation, it was found that when the RF power was decreased to approximately 5 watts, the etch rate dropped substantially. However, the etch rate could be increased by heating the wafer 19 to approximately 90 degrees centigrade. Through experimentation, the etching rate of the wafer has been found to vary between approximately 100 angstroms per minute and approximately four (4) microns per minute.

Figure 2:
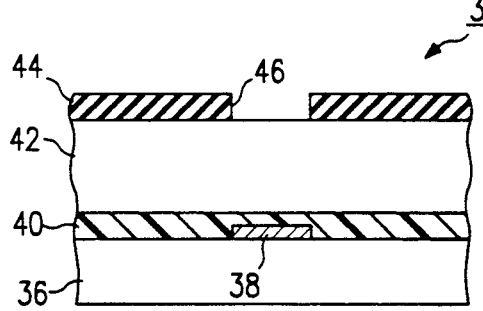
FIGS. 2–4 are successive schematic magnified cross-sectional views of an integrated circuit structure showing successive steps in the fabrication of a via according to the present invention.
Figure 3:
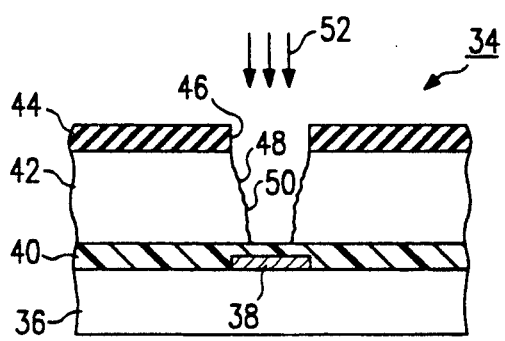
Figure 4:
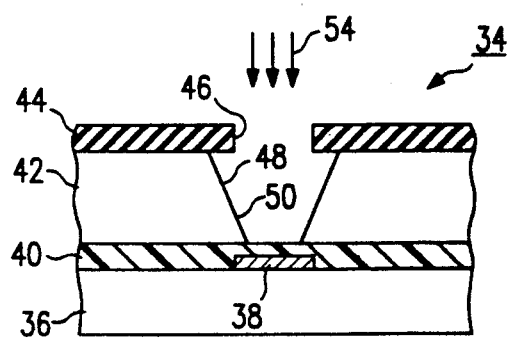

Referring to FIGS. 2-4, an exemplary fabrication process according to the invention is illustrated, showing the formation of a via in a HgCdTe layer.

In FIG. 2, a signal processor 36 is provided. Other structures can be substituted for processor 36 in accordance with the present invention such as a microprocessor which is directly fed to processor 36. An aluminum pad 38 is formed onto signal processor 36. A HgCdTe layer 42 is connected to signal processor 36 and aluminum pad 38 by an epoxy layer 40. The present process is illustrative of a method of etching through and forming a via and is not intended to be limited only to the HgCdTe layer. For example, layer 42 may be a ZnS layer, CdTe layer or the like.

To form the via through layer 42, a photoresist pattern 44 is formed onto layer 42. By forming the pattern 44 onto layer 42, an opening 46 can be formed for selectively etching through layer 42. Pattern 44 may be a NOVOLAK TM composition, or other commercial photoresist compositions.

Referring to FIG. 3, the process of etching through layer 42 in accordance with the present invention can be seen. Device 34 is exposed to a gas phase etchant 52; this comprises a dry etching technique in accordance with the present disclosure. In its preferred embodiment, etchant 52 is RF-activated methane. The etchant 52 reactively removes the layer 42 to form a via 50. Via 50 has wall 48 which exhibits a rough texture. The roughness of wall 48 is not desirable for the manufacturing of infrared detectors. Accordingly, it is preferable to use subsequent processing to form a smooth wall for via 50.

Referring to FIG. 4, a method for smoothing wall 48 is shown. After the dry etching process is complete, the wafer is removed from the etching apparatus. Device 34 is exposed to a wet etchant 54, as by spray-etching, after the dry etching process. Wet etchant 54 is preferably a bromine methanol solution, such as a 1/16th percent concentration of bromine in methanol. Once the device 34 has been exposed to wet etchant 54, walls 48 are smoothed, and expanded.

After walls 48 have been smoothed, photoresist pattern 44 is removed by solvent strip or oxygen-plasma exposure. In the prior art, photoresist pattern 44 was removed after dry etching the HgCdTe layer. By keeping the photoresist 44 in place, the process allows for selective wet-etching of the HgCdTe layer or the ZnS layer. Additionally, it has been found that the physical damage to the remaining HgCdTe layer is reduced when pattern 44 is left until after wet etchant 54 exposure. In practice, this method of etching can be applied to form vias within suitable substrates such as the materials previously described and also CdTe, CdZnTe, GaAs, and HgCdZnTe. The method can also be applied to form interconnect formations with metal such as aluminum, indium, platinum, silver, zinc, or a plurality of different other electrical contacting metals. The present invention used for forming vias in device 34 can be more readily understood by referring to the example below.

EXAMPLE II

An experiment was performed to determine the etch rate when using a HgCdTe layer having an activated methane source (methane radicals for example) as the active etchant. This experiment also determined that the via diameter size increased after the follow-up wet etching of the bromine methanol. A 100 mm diameter wafer contained a HqCdTe layer mounted upon it with standard epoxy and was baked at 90 degrees centigrade for 30 minutes. The vias were etched in the diode plasma reactor using methane at a rate of approximately 3600 angstroms per minute while the sample surface was approximately 15 degrees centigrade. After etching and removal from the plasma etching apparatus, the wafers were exposed to a solution of 1/16th percent bromine in methanol for 45 seconds. Subsequently, the photoresist layer was stripped off of the HgCdTe layer. Additionally, the wall of the via was found to be smooth.

When using the present invention, several advantages have been encountered. These advantages include the reduction of a processing step because of the elimination of a remote microwave plasma activation step. Additionally, the present invention does not require a corrosive fluorine composition to be used for activating the methane plasma. Additionally, when using hydrogen as the active etchant, no polymerization occurs on the wafer. This process is found to have an advantageous anisotropic etching profile, i.e. very little undercutting. Additionally, the present invention features a simplified process which can etch through HgCdTe and ZnS layers to create smooth via walls and which minimizes the physical damage by ion bombardment to other layers of the wafer.

In summary, a dry etchant gas for etching HgCdTe and ZnS layers with high selectivity to form vias in the layers has been disclosed. The etchant is capable of etching through the plurality of compositions which can be formed from the Group II and Group VI elements. The present invention has great versatility with respect to etchant gases capable of reaction with the II–VI materials; however, it is preferable to use hydrogen or methane gas as the activation gas to etch through HgCdTe or ZnS layers.

While preferred embodiments and their advantages have been detailed in the above description, the invention is not limited hereto but only by the spirit and scope of the appended claims.

What is claimed is:

1. A method for forming openings in a wafer made of Group II and Group VI elements in a vacuum plasma reactor comprising the steps of:
   forming a photoresist pattern on the surface of the wafer;
   introducing a methylradical liberating hydrocarbon into the reactor;
   dry etching the openings in the wafer by forming activated methylradicals in an in situ generated plasma to etch the openings;
   removing the wafer from the vacuum plasma reactor;
   wet etching the openings in the wafer to smooth and expand the openings to a selected dimension; and
   removing the photoresist layer.

2. The method of claim 1, wherein the wafer comprises zinc sulfide.

3. The method of claim 1, wherein the wafer comprises mercury cadmium telluride.

4. The method of claim 1, wherein the photoresist is a NOVOLAK TM composition.

5. The method of claim 1, wherein said step of wet etching comprises spray-etching a bromine-methanol solution onto the wafer.

6. A method for forming openings in a wafer made of Group II and Group VI elements in a vacuum plasma reactor, comprising the steps of:
   forming a photoresist pattern on the surface of the wafer;
   introducing hydrogen gas into the reactor;
   dry etching the openings in the wafer with hydrogen-radicals formed by in situ plasma generation;
   removing the wafer from the vacuum plasma reactor;
   wet etching the openings in the wafer to smooth and expand the openings to a selected dimension; and
   removing the photoresist pattern.

7. The method of claim 6, wherein the wafer comprises zinc sulfide.

8. The method of claim 6, wherein the wafer comprises mercury cadmium telluride.

9. The method of claim 6, wherein said photoresist is a NOVOLAK TM composition.

10. The method of claim 6, wherein said step of wet etching comprises spray-etching a bromine-methanol solution onto the wafer.

11. A method for forming sidewalls in a wafer made of Group II and Group VI elements in a vacuum plasma reactor comprising the steps of:
    forming a photoresist pattern on the surface of the wafer;
    introducing a methylradical liberating hydrocarbon into the reactor;
    dry etching the sidewalls in the wafer by forming activated methylradicals in an in situ generated plasma to etch the sidewalls;
    removing the wafer from the vacuum plasma reactor;
    wet etching the sidewalls in the wafer to smooth and expand the sidewalls to a selected dimension; and
    removing the photoresist layer.

12. The method of claim 11, wherein the wafer comprises zinc sulfide.

13. The method of claim 11, wherein the wafer comprises mercury cadmium telluride.

14. The method of claim 11, wherein the photoresist is a NOVOLAK TM composition.

15. The method of claim 11, wherein said step of wet etching comprises spray-etching a bromine-methanol solution onto the wafer.

16. A method for forming sidewalls in a wafer made of Group II and Group VI elements in a vacuum plasma reactor, comprising the steps of:
    forming a photoresist pattern on the surface of the wafer;
    introducing hydrogen gas into the reactor;
    dry etching the sidewall in the wafer with hydrogen-radicals formed by in situ plasma generation;
    removing the wafer from the vacuum plasma reactor;
    wet etching the sidewalls in the wafer to smooth and expand the sidewalls to a selected dimension; and
    removing the photoresist pattern.

17. The method of claim 16, wherein the wafer comprises zinc sulfide.

18. The method of claim 16, wherein the wafer comprises mercury cadmium telluride.

19. The method of claim 16, wherein said photoresist is a NOVOLAK TM composition.

20. The method of claim 16, wherein said step of wet etching comprises spray-etching a bromine-methanol solution onto the wafer.

* * * * *